(12) United States Patent
Li et al.

(10) Patent No.: US 7,314,842 B2
(45) Date of Patent: Jan. 1, 2008

(54) SUBSTITUTED BARIUM TITANATE AND BARIUM STRONTIUM TITANATE FERROELECTRIC COMPOSITIONS

(75) Inventors: Dong Li, Newark, DE (US); Munirpallam Appadorai Subramanian, Kennett Square, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/491,442

(22) Filed: Jul. 21, 2006

(65) Prior Publication Data

US 2007/0049486 A1 Mar. 1, 2007

Related U.S. Application Data

(62) Division of application No. 11/088,652, filed on Mar. 24, 2005, now Pat. No. 7,094,721, which is a division of application No. 10/258,251, filed on Oct. 21, 2002, now Pat. No. 6,916,755.

(51) Int. Cl.
  C04B 35/468 (2006.01)
  G01R 23/02 (2006.01)
  H01P 1/18 (2006.01)
  H01P 3/08 (2006.01)

(52) U.S. Cl. ............... 501/138; 505/139; 333/161; 250/250

(58) Field of Classification Search ........... 501/138, 501/139; 333/161; 250/250
See application file for complete search history.

(56) References Cited

U.S. PATENT DOCUMENTS 5,427,998 A 6/1995 Umemura et al.
5,472,935 A 12/1995 Yandrofski et al.

FOREIGN PATENT DOCUMENTS

JP 63 301 409 12/1988
WO WO 01/83396 11/2001

OTHER PUBLICATIONS

Li et al "Ferroelectric Tunability Studies in Doped BaTiO3 and Ba1–xSrxTiO3", Materials Research Society Symposium Proceedings, Symposium GG (Solid State Chemistry of Inorganic Materials), Nov. 27-30, 2000.*

Dong Li et al; Novel tunable ferroelectric compositions: $Ba_{1-z}Ln_2Ti_{1-g}M_gO_3$ (Ln =La, Sm, Gd, Dy. M = Al, Fe, Cr); Solid State Sciences 2 (2000), pp. 507-512; Elsevier.

S. Skapin et al; Chemical Reactions and Dielectric Properties of the $BaTiO_3$—$LaAlO_3$ and $BaTiO_3$—$LaAlO_3$—$LaTi_{3/4}O_3$ Systems; Journal of Solid State Chemistry 129, pp. 223-230 (1997); Academic Press; Ljubljana. Slovenia.

J. Schwarzbach; Semiconducting Ceramic Barium Lanthanum Titanate Doped with Iron; Czech. J. Phys.; B 18 (1968), pp. 1322-1334.

A. Inoue, et al. Effect of Iron-Group-Ion Doping on the Properties of $BaTiO_3$ Ceramics, Institute of Applied Physics, (1991) pp. 2388-2390, vol. 30, No. 9B, Sakura, Ibaraki.

Hagermann, H.J., et al. Reversible Weight Change of Acceptor-Doped $BaTiO_3$, Journal of the American Ceramic Society, (1981) pp. 590-594, Federal Republic of Germany.

Sengupta, et al. Breakthrough advances in low loss, tunable dielectric materials, Mat Res Innovat, (1999) pp. 278-282.

Li et al. Structural Charaterization of the Complex Perovskitas Ba1-xLaxTi1-xCrxO3, Journal of Solid State Chemistry, 164, 98-105 (2002).

I.H. Ismailzade et. al., The Magnetoelectric (ME) H Effect at the Ferroelectric and Antiferroelectric Phase Transitions, Department of Radiation Investigations, Academy of Sciences of the Azerbaidzhan SSR, Baku, (1980) pp. 191-194. Azerbaidzhan SSR, USSR.

Li et al "ferroelectric Tunability Studies in Doped Ba TIO3 and Ba1-xSrxTiO3", Materials Research Society Symposium Proceedings. Symposium GG (Solid State Chemistry of Inorganic Materials), Nov. 27-30, 2000.

* cited by examiner

Primary Examiner—Mark Kopec

(57) ABSTRACT

This invention provides the three novel La,Fe, La,Cr and Sm,Fe substituted barium titanate solid solution ferroelectric compositions with the formula $Ba_{1-x}Ln_xTi_{1-x}M_xO_3$ wherein when Ln is La, M is Fe or Cr, when Ln is Sm, M is Fe and x is from about 0.02 to about 0.06 and mixtures thereof, the novel La,Fe substituted barium strontium titanate solid solution ferroelectric compositions with the formula $(Ba_{1-y}Sr_y)_{1-x}La_xTi_{1-x}Fe_xO_3$ wherein y is greater than zero and less than about 0.6 and x is from about 0.01 to about 0.06 and the novel La,Al substituted barium strontium titanate solid solution ferroelectric compositions with the formula $(Ba_{1-y}Sr_y)_{1-x}La_xTi_{1-x/4-3a/4}Al_a\square_{(x-a)/4}O_3$ wherein $\square$ denotes a vacancy, y is greater than zero and less than about 0.6, a is from about 0.01 to about 0.06 and x is from 0.02 to about 0.10 with the proviso that x is greater than or equal to a.

These low loss tunable ferroelectric compositions are especially useful in tunable microwave thin film devices which fall into three types: interdigital and trilayer capacitors, coplanar waveguides and microstrips.

6 Claims, No Drawings

SUBSTITUTED BARIUM TITANATE AND BARIUM STRONTIUM TITANATE FERROELECTRIC COMPOSITIONS

This application is a DIV of Ser. No. 11/088,652 (filed Mar. 24, 2005, now U.S. Pat. No. 7,094,721), which application is a DIV of Ser. No. 10/258,251 (filed Oct. 21, 2002, now U.S. Pat. No. 6,916,755), which application is a 371 of PCT/US01/14152 (filed May 02, 2001), which claims the benefit of 60/201,807 (filed May 04, 2000).

FIELD OF THE INVENTION

This invention relates to La,Fe, La,Cr and Sm,Fe substituted barium titanate and La,Fe and La,Al substituted barium strontium titanate ferroelectric compositions that have useful dielectric properties.

BACKGROUND OF THE INVENTION

The use of dielectric materials to increase capacitance is well-known. Earlier capacitor dielectrics fell into two categories. The first category of dielectrics has a relatively temperature-independent dielectric constant but the value of the dielectric constant is low, e.g., 5–10. Materials such as electrical porcelain and mica fall in this category. The second category of dielectrics has very high dielectric constant, e.g., 1000 or more, but they are quite temperature dependent. An example is barium titanate, $BaTiO_3$.

Since capacitance of a dielectric material is proportional to its dielectric constant, high dielectric constant materials are desired. In order to perform acceptably in tuning or resonance circuits, the dielectric must also have a dielectric constant that exhibits minimal temperature dependence; otherwise, small changes in ambient temperature will throw the circuit out of resonance. Other applications require a dielectric constant that exhibits minimal frequency dependence. It is also desirable to have the loss or dissipation factor as small as possible.

For many microwave devices, the important material features are the dielectric tunability, i.e., the change in dielectric constant with applied voltage, and low dielectric loss. Barium strontium titanate, $Ba_{1-x}Sr_xTiO_3$, has been used in some such applications (see U.S. Pat. No. 5,427,998), but the need persists for materials with better properties.

Ismailzade et al., *Phys. Stat. Sol. (a)*, 59, K191 (1980), studies the ferroelectric transitions of the system $(1-x)BaTiO_{3-x}BiFeO_3$ ($x=0.05$ and $0.08$) and reported transition temperatures of 106° C. and 85° C., respectively.

Hagemann et al., *J. Amer. Ceramic Soc.*, 64 (10) 590 (1981), studied the defect chemistry of $BaTiO_3$ doped with acceptors Cr, Mn, Fe, Co and Ni. They note that conventional titanate formulations usually contain donor dopants like Nb or La, requiring that sintering and all subsequent high temperature treatments be performed at high partial pressure of oxygen.

Inoue et al., *Jpn. J. Appl. Phys.*, 30 (9B), 2388 (1991), measured the dielectric constant and losses in $BaTiO_3$ ceramics doped with acceptors Fe, Ni, Cu and Nb.

Skapin-et al., *J. Solid State Chem.*, 129, 223 (1997) found that the solid $(Ba,La)(Ti,Al)O_3$ exhibits relatively low permittivities and very low dielectric losses.

Sengupta et al., *Mat. Res. Innovat.*, 2, 278 (1999), investigate the effects of acceptor and donor doping on the electronic properties of barium strontium titanate thin films by doping with 1 mole % of Mg, La, Ta and Al. They state that MgO doping produced the best effect on lowering the loss tangents at microwave frequencies while maintaining tunability.

Sengupta et al., U.S. Pat. No. 5,427,988, disclose ceramic ferroelectric composite material consisting essentially of barium strontium titanate, $Ba_{1-x}Sr_xTiO_3$, wherein x is greater than 0.0 and less than or equal to 0.75, and magnesium oxide, MgO, in amounts to provide a composite having a low dielectric constant, low loss tangent and high tunability. Their preferred weight ratio of $Ba_{1-x}Sr_xTiO_3$ to MgO ranges from approximately 99%–40% $Ba_{1-x}Sr_{3x}TiO$ to 1%–60% MgO.

Yandrofski et al., U.S. Pat. No. 5,472,935, disclose tuneable microwave devices incorporating tuneable ferroelectrics.

SUMMARY OF THE INVENTION

This invention provides the three novel La,Fe, La,Cr and Sm,Fe substituted barium titanate solid solution ferroelectric compositions with the formula $Ba_{1-x}Ln_xTi_{1-x}M_xO_3$ wherein when Ln is La, M is Fe or Cr, when Ln is Sm, M is Fe and x is from about 0.02 to about 0.06 and mixtures thereof. Preferably, x is from about 0.03 to about 0.05. Most preferred is x=0.04.

This invention also provides novel La,Fe and La,Al substituted barium strontium titanate solid solution ferroelectric compositions. The La,Fe substituted composition has the formula $(Ba_{1-y}Sr_y)_{1-x}La_xTi_{1-x}Fe_xO_3$ wherein y is greater than zero and less than about 0.6 and x is from about 0.01 to about 0.06. Preferably, y is from about 0.2 to about 0.5 and x is from about 0.03 to about 0.05. Most preferred is y about 0.4 and x=0.04. The La,Al substituted composition has the formula $(Ba_{1-y}Sr_y)_{1-x}La_xTi_{1-x/4-3a/4}Al_a\square_{(x-a)/4}O_3$ wherein $\square$ denotes a vacancy, y is greater than zero and less than about 0.6, a is from about 0.01 to about 0.06 and x is from 0.02 to about 0.10 with the proviso that x is greater than or equal to a. Preferably, y is from about 0.2 to about 0.5, a is from about 0.01 to about 0.04 and x is from about 0.03 to about 0.10. Most preferred is the composition with y about 0.4, a=0.02 and x=0.06.

These low loss tunable ferroelectric compositions are especially useful in tunable microwave thin film devices which are tuneable as a result of the use of these ferroelectric compositions. Such devices fall into three types: interdigital and trilayer capacitors, coplanar waveguides and microstrips.

DETAILED DESCRIPTION OF THE PREFERRED EMBODIMENTS

The solid solution ferroelectric oxide compositions of this invention have dielectric properties that provide advantages in tunable microwave devices over the commonly used $Ba_{0.6}Sr_{0.4}TiO_3$.

$Ba_{1-x}Ln_xTi_{1-x}M_xO_3$ compositions can be synthesized by the following procedure. Stoichiometric amounts of the precursors are thoroughly mixed. The precursors $BaTiO_3$, $Ln_2O_3$ and $M_2O_3$ are preferred. The mixed precursor powder is calcined at about 1000° C. for about 8 hours. The calcined powder is reground and pressed to 12.7 mm diameter/1–2 mm thick disks. The disks are sintered in air at about 1275° C. for 20 hours. In both the calcining and sintering steps, the temperature ramping up rate is about 200° C./hour from room temperature, i.e., about 20° C., to the calcining or sintering temperature and the cooling rate is about 150°

C./hour from the calcining or sintering temperature to room temperature, i.e., about 20° C.

$$(Ba_{1-y}Sr_y)_{1-x}La_xTi_{1-x}Fe_xO_3 \quad \text{and}$$

$(Ba_{1-y}Sr_y)_{1-x}La_xTi_{1-x/4-3a/4}Al_a\square_{(x-a)/4}O_3$ compositions can be synthesized by the following procedure. Stoichiometric amounts of the precursors are thoroughly mixed. The precursors $BaTiO_3$, $SrCO_3$, $TiO_2$, $La_2O_3$ and $Fe_2O_3$ or $Al_2O_3$ respectively are preferred. The mixed precursor powder is calcined at about 1000° C. for about 8 hours. The calcined powder is reground and pressed to 12.7 mm diameter/1–2 mm thick disks. The disks are sintered in air at about 1325° C. for 20 hours. In both the calcining and sintering steps, the temperature ramping up rate is about 200° C./hour from room temperature, i.e., about 20° C., to the calcining or sintering temperature and the cooling rate is about 150° C./hour from the calcining or sintering temperature to room temperature, i.e., about 20° C.

All of the substituted compositions of the invention crystallize in a pseudo-cubic or cubic perovskite related structure.

Dielectric measurements were carried out on the disk samples. The faces of the disk-shaped samples were polished with a fine-grit sand or emery paper to produce flat uniform surfaces. Silver paint electrodes were applied on the faces and dried at 200° C. The capacitance and the dielectric loss measurements were performed by the two-terminal method using a Hewlett-Packard 4275A LCR bridge at room temperature, about 20° C., and at a frequency of 1 MHz and the capacitance, C, and the dissipation factor are read directly from the bridge. Below room temperature, a Hewlett-Packard 4284A LCR bridge was used. The dielectric constant (K) was calculated from the measured capacitance, C in picofarads, from the relationship, $K=(100\ C\ t)/(8.854\ A)$, where t is thickness of the disk shaped sample in cm and A is the area of the electrode in $cm^2$. Voltages of up to 100 Volts were applied across the flat electroded faces of the disks using a Keithley 228A voltage/current source and tunability was calculated by measuring the change in dielectric constant with applied voltage. The tunability, T, is calculated from the equation $T=[K(0)-K(V)]/K(0)$ where $K(0)$ is the dielectric constant when there is no applied voltage and $K(V)$ is the dielectric constant when there is an applied voltage V. The tunability is usually expressed as a percent for a given applied electric field so that the above result for T is multiplied by 100 orbit is written as T=(constant) E where T is the tunability in %, E is the electric field and the constant is characteristic of the particular material.

EXAMPLES OF THE INVENTION

Examples 1–3, Comparative Experiments A–G $Ba_{0.96}La_{0.04}Ti_{0.96}Fe_{0.04}O_3$, $Ba_{0.96}Sm_{0.04}Ti_{0.96}Fe_{0.04}O_3$ and $Ba_{0.96}La_{0.04}Ti_{0.96}Cr_{0.04}O_3$ are the solid solution ferroelectric oxide compositions of Examples 1–3 respectively. $Ba_{1-x}Ln_xTi_{1-x}M_xO_3$, wherein when Ln is Gd, Dy or Bi, M is Fe, when Ln is La, M is Al or Ga, and x is 0.04, are the solid solution oxide compositions of Comparative Experiments A–E. Solid solution oxide of the formula $Ba_{1-x}Ln^{3+}_xTi_{1-x}M^{3+}_xO_3$, wherein Ln=La, Sm, Gd, Bi and M=Al, Ga, Fe, Cr, were prepared by the following procedure. Appropriate amounts of starting oxides $BaTiO_3$, $Ln_2O_3$ and $M_2O_3$ were weighed according to the stoichiometric ratios and mixed thoroughly in an agate mortar. The gram amounts of the precursors-used in each instance are shown in Table 1.

TABLE 1

| | | Precursors | | |
|---|---|---|---|---|
| Ex. or Comp. | Composition | $BaTiO_3$ (g) | $Fe_2O_3$ (g) | $Ln_2O_3$ (g) |
| 1 | $Ba_{.96}La_{.04}Ti_{.96}Fe_{.04}O_3$ | 1.4376 | 0.0205 | 0.0418, Ln = La |
| 2 | $Ba_{.96}Sm_{.04}Ti_{.96}Fe_{.04}O_3$ | 1.4348 | 0.0204 | 0.0446, Ln = Sm |
| A | $Ba_{.96}Gd_{.04}Ti_{.96}Fe_{.04}O_3$ | 1.4331 | 0.0204 | 0.0464, Ln = Gd |
| B | $Ba_{.96}Dy_{.04}Ti_{.96}Fe_{.04}O_3$ | 1.4318 | 0.0204 | 0.0477, Ln = Dy |
| C | $Ba_{.96}Bi_{.04}Ti_{.96}Fe_{.04}O_3$ | 1.4206 | 0.0591 | 0.0202, Ln = Bi |
| | | $BaTiO_3$ (g) | $La_2O_3$ (g) | $M_2O_3$ (g) |
| D | $Ba_{.96}La_{.04}Ti_{.96}Al_{.04}O_3$ | 1.4447 | 0.042 | 0.0131, M = Al |
| E | $Ba_{.96}La_{.04}Ti_{.96}Ga_{.04}O_3$ | 1.4342 | 0.0417 | 0.024, M = Ga |
| 3 | $Ba_{.96}La_{.04}Ti_{.96}Cr_{.04}O_3$ | 1.4385 | 0.0418 | 0.0195, M = Cr |
| | | $BaCO_3$ (g) | $SrCO_3$ (g) | $TiO_2$ (g) |
| F | $BaTiO_3$ | 1.3539 | — | 0.548 |
| G | $Ba_{0.6}Sr_{0.4}TiO_3$ | 0.8325 | 0.4152 | 0.5616 |

The mixed powder of each Example was calcined at 1000° C. for 8 hours. The calcined powder was reground and pressed to 12.7 mm dia/1–2 mm thick disks. The disks were sintered in air at 1275° C. for 20 hours. In both the calcining and sintering steps, the temperature was increased from room temperature, i.e., about 20° C., to the calcining or sintering temperature at a rate of 200° C./hour and the temperature was decreased from the calcining or sintering temperature to room temperature, i.e., about 20° C., at a rate of 150° C./hour.

Samples of $BaTiO_3$ and $Ba_{0.6}Sr_{0.4}TiO_3$ were prepared for Comparative Experiments F and G using the precursors $BaCO_3$, $SrCO_3$ and $TiO_2$ in the amounts shown in Table 1. The mixed powder was pressed to 12.7 mm dia/1–2 mm thick disks. The disks were sintered in air at 1450° C. for 20 hours in the case of $BaTiO_3$ and at 1350° C. for 20 hours in the case of $Ba_{0.6}Sr_{0.4}TiO_3$. The temperature was increased from room temperature, i.e., about 20° C., to the sintering temperature at a rate of 200° C./hour and the temperature was decreased from the sintering temperature to room temperature, i.e., about 20° C., at a rate of 150° C./hour.

X-ray powder diffraction patterns were recorded for each sample with a Siemens D5000 diffractometer. The data showed all the samples crystallized in a pseudo-cubic or cubic perovskite related structure and the lattice parameters are given in Table 2.

TABLE 2

| Example or Comparative Experiment | Cubic Lattice Parameter (nm) (±0.0003) |
|---|---|
| 1 | 0.3999 |
| 2 | 0.4002 |
| A | 0.4000[#] |
| B | 0.4001[#] |
| C | 0.4011 |
| D | 0.4002 |
| E | 0.3998 |
| 3 | 0.4000 |
| F | 0.4009[#] |
| G | 0.3965 |

[#]pseudo-cubic cell value.

The disk samples were polished to produce flat uniform surfaces and the two flat surfaces were painted with silver paint to provide electrodes. The painted samples were dried at 70–100° C. overnight. Capacitance and loss tangent measurements were taken on a HP-4275A LCR meter at room temperature, i.e., about 20° C., at a frequency of 1 MHz. Voltages up to 100V were applied across the flat electroded faces of the disks using an Keithley 228A voltage/current source and the dielectric constant was measured as a function of applied voltage. The dielectric constant with no voltage applied, the loss tangent, the percent tunability and the applied electric filed to obtain that magnitude tunability are shown in Table 3. Measurements were carried out at room temperature, i.e., about 20° C., and at a frequency of 1 MHz.

TABLE 3

| Example or Comparative Experiment | Dielectric Constant | Loss Tangent | Tunability (Percent) | Electric Field (V/μm) |
|---|---|---|---|---|
| 1 | 4350 | 0.0130 | 4.2 | 0.053 |
| 2 | 1857 | 0.0180 | 1.2 | 0.061 |
| A | 929 | 0.0309 | 1.2 | 0.063 |
| B | 525 | 0.0225 | 0 | 0.064 |
| C | 637.3 | 0.0156 | 0.6 | 0.066 |
| D | 1713 | 0.0127 | 0.8 | 0.073 |
| E | 1461 | 0.0111 | 0.2 | 0.073 |
| 3 | 536 | 0.0060 | 1.6 | 0.059 |
| F | 1195 | 0.0080 | 0 | 0.077 |
| G | 2551 | 0.0115 | 2.7 | 0.060 |

The tunability equation written in the form T=(constant) E is given in Table 4 for each Example and Comparative Experiment. Measurements were carried out at room temperature, i.e., about 20° C., and at a frequency of 1 MHz.

TABLE 4

| Example or Comparative Experiment | Tunability Equation (T: tunability in %, E: electric field in V/μm) |
|---|---|
| 1 | T = 74.3 E |
| 2 | T = 21.0 E |
| A | Frequency dependent, tetragonal |
| B | No tuning |
| C | T = −10.6 E |
| D | T = 11.4 E |
| E | T = 2.6 E |
| 3 | T = 27.2 E |
| F | No tuning |
| G | T = 38.4 × (E) |

The results show that the composition $Ba_{0.96}La_{0.04}Ti_{0.96}Fe_{0.04}O_3$ has a tunability of nearly twice that of $Ba_{0.6}Sr_{0.4}TiO_3$ along with a somewhat higher dielectric constant and a comparable dielectric loss. $Ba_{0.96}Sm_{0.04}Ti_{0.96}Fe_{0.04}O_3$ has a tunability of about half that of $Ba_{0.6}Sr_{0.4}TiO_3$ along with a somewhat lower dielectric constant and a comparable dielectric loss. $Ba_{0.96}La_{0.04}Ti_{0.96}Cr_{0.04}O_3$ has a dielectric loss of about half, a dielectric constant about 1/3 and a tunability of about 7/10 that of $Ba_{0.6}Sr_{0.4}TiO_3$.

Examples 4–12, Comparative Experiments H–K

The compositions with the formula $(Ba_{1-y}Sr_y)_{0.96}La_{0.04}Ti_{0.96}Fe_{0.04}O_3$, alternatively written as $(Ba_{1-y}Sr_y)TiO_3$:4% La4% Fe, with y=0.2, 0.4 and 0.6 are the solid solution ferroelectric oxide compositions of Examples 4, 5 and 6, respectively. The compositions with the formula $(Ba_{1-y}Sr_y)_{0.96}La_{0.04}Ti_{0.96}Al_{0.04}O_3$, alternatively written as $(Ba_{1-y}Sr_y)TiO_3$:4% La4% Al, with y=0.2, 0.4 and 0.6 are the solid solution ferroelectric oxide compositions of Examples 7, 8 and 9, respectively. The compositions with the formula $(Ba_{1-y}Sr_y)_{0.94}La_{0.06}Ti_{0.97}Al_{0.02}\square_{0.01}O_3$, alternatively written as $(Ba_{1-y}Sr_y)TiO_3$:6% La2% Al, with y=0.2, 0.4 and 0.6 are the solid solution ferroelectric oxide compositions of Examples 10, 11 and 12, respectively. The solid solution oxides were prepared by the following procedure. Appropriate amounts of starting oxides $BaTiO_3$, $SrCO_3$, $TiO_2$, $La_2O_3$, $Al_2O_3$ and $Fe_2O_3$ were weighed according to the stoichiometric ratios and mixed thoroughly in an agate mortar. The gram amounts of the precursors used in each instance are shown in Table 5.

TABLE 5

| Ex. or Comp. Exp. - Composition | | $BaTiO_3$ (g) | $SrCO_3$ (g) | $TiO_2$ (g) | $La_2O_3$ (g) |
|---|---|---|---|---|---|
| | | | | $Fe_2O_3$ (g) | |
| 4 | $Ba_{0.8}Sr_{0.2}TiO_3$: 4%La4%Fe | 1.2017 | 0.1877 | 0.0105 | 0.0213 | 0.0436 |
| 5 | $Ba_{0.6}Sr_{0.4}TiO_3$: 4%La4%Fe | 0.9449 | 0.3919 | 0.212 | 0.0223 | 0.0455 |
| 6 | $Ba_{0.4}Sr_{0.6}TiO_3$: 4%La4%Fe | 0.6491 | 0.6272 | 0.3393 | 0.0233 | 0.0477 |
| | | | | $Al_2O_3$ (g) | |
| 7 | $Ba_{0.8}Sr_{0.2}TiO_3$: 6%La2%Al | 1.1374 | 0.1824 | 0.1142 | 0.0066 | 0.0635 |
| 8 | $Ba_{0.6}Sr_{0.4}TiO_3$: 6%La2%Al | 0.8868 | 0.3809 | 0.2224 | 0.0069 | 0.0663 |
| 9 | $Ba_{0.4}Sr_{0.6}TiO_3$: 6%La2%Al | 0.6281 | 0.5859 | 0.334 | 0.0072 | 0.0692 |
| 10 | $B_{0.8}Sr_{0.2}TiO_3$: 4%La4%Al | 1.1435 | 0.1786 | 0.0966 | 0.0129 | 0.0414 |
| 11 | $B_{0.6}Sr_{0.4}TiO_3$: 4%La4%Al | 0.8994 | 0.373 | 0.2018 | 0.0135 | 0.0433 |
| 12 | $B_{0.4}Sr_{0.6}TiO_3$: 4%La4%Al | 0.618 | 0.5971 | 0.3231 | 0.0142 | 0.0454 |
| H | $Ba_{0.8}Sr_{0.2}TiO_3$ | 1.2534 | 0.1983 | 0.1073 | — | — |
| I | $Ba_{0.6}Sr_{0.4}TiO_3$ | 0.9838 | 0.4152 | 0.2246 | — | — |
| J | $Ba_{0.4}Sr_{0.6}TiO_3$ | 0.6879 | 0.6532 | 0.3534 | — | — |
| K | $Ba_{0.2}Sr_{0.8}TiO_3$ | 0.3616 | 0.9158 | 0.4955 | — | — |

Samples of barium strontium titanate were prepared as Comparative Experiments H–K using appropriate amounts of the precursors $BaTiO_3$, $SrCO_3$ and $TiO_2$ which were weighed according to the stoichiometric ratios and mixed thoroughly in an agate mortar. The gram amounts of the precursors used in each instance are shown in Table 5.

The mixed powder of each Example and Comparative Experiment was calcined at 1000° C. for 8 hours. The calcined powder was reground and pressed to 12.7 mm dia/1–2 mm thick disks. The disks were sintered in air at 1325° C. for 20 hours. In both the calcining and sintering steps, the temperature was increased from room temperature, i.e., about 20° C., to the calcining or sintering temperature at a rate of 200° C./hour and the temperature was decreased from the calcining or sintering temperature to room temperature, i.e., about 20° C., at a rate of 150° C./hour.

X-ray powder diffraction patterns were recorded with a Siemens D5000 diffractometer. The data showed all the samples were crystallized in a pseudo-cubic or cubic perovskite related structure and the lattice parameters are given in Table 6. There are obvious $BaAl_2O_4$ impurities in 4% La4% Al doped samples. The presence of this impurity is minimal in the 6% La2% Al doped samples.

The disk samples were polished to produce flat uniform surfaces and the two flat surfaces were painted with silver paint to provide electrodes. The painted samples were dried at 70–100° C. overnight. Capacitance and loss tangent measurements were taken on a HP-4275A LCR meter at room temperature. Voltage up to 100V was applied to the sample by Keithley 228A voltage/current source. Measurements were carried out at room temperature, i.e., about 20° C., and at a frequency of 1 MHz. Results for the dielectric constants, loss tangents, and tunability equations for the samples are given in Table 6.

TABLE 6

| Example or Comparative Experiment | Lattice Parameter a (nm) (±0.0003) | Dielectric Constant | Loss Tangent | Tunability Equation. (T: tunability in %, E: electric field in V/μm) |
|---|---|---|---|---|
| 4 | 0.3982 | 1032 | 0.0347 | T = 16.6 E |
| 5 | 0.3964 | 253 | 0.0349 | T = 7.88 E |
| 6 | 0.3939 | 342 | 0.0446 | No tuning |
| 7 | 0.3975 | 620 | 0.0043 | T = 5.61 E |
| 8 | 0.3956 | 388 | −0.0005 | No tuning |
| 9 | 0.3936 | 235 | −0.0003 | No tuning |
| 10 | 0.3975 | 951 | 0.0071 | T = 6.80 E |
| 11 | 0.3955 | 361 | 0.0022 | No tuning |
| 12 | 0.3932 | 184 | 0.0016 | No tuning |
| H | 0.3982, c = 0.4000 # | 1998 | 0.0330 | T = 8.26 E |
| I | 0.3967, c = 0.3966 # | 2621 2340 | 0.0117 0.0045 | T = 38.4 E T = 13.1 E |
| J | 0.3938 | 792 | 0.0002 | No tuning |
| K | 0.3916 | 329 | −0.0013 | No tuning |

Tunability, T = [ϵ (v = 0) − ϵ (v ≠ 0)]/ϵ (v = 0)]
pseudo-cubic cell value.

The sample of Example 4, $Ba_{0.8}Sr_{0.2}TiO_3$:4% La4% Fe has a tunability comparable to that of Comparative Experiment I sample of $Ba_{0.6}Sr_{0.4}TiO_3$. The Al-doped samples show low loss. The pure barium strontium titanate samples remain tetragonal up to about the composition of Comparative Experiment I, $Ba_{0.6}Sr_{0.4}TiO_3$. The doped samples are all cubic at room temperature.

The substitution of La,Al and La,Fe lowers the Curie temperature of $Ba_{0.8}Sr_{0.2}TiO_3$. The three phase transitions areas for the unsubstituted barium strontium titatante are spread into one for the La,Al and La,Fe substituted samples. La,Al substitution shows a larger decrease in the Curie temperature. La,Al substituted $Ba_{0.6}Sr_{0.4}TiO_3$ shows the transition peak around 80K. Substitution also changes the loss tangent. The loss tangents of La,Al substituted samples were lower than that of the unsubstituted samples, especially close to room temperature. The La,Fe substituted samples show lower loss in the low temperature region. However the La,Fe substitution results in the substituted composition being a semiconductor and so the loss tangents at room temperature are higher.

The typical barium strontium titanate $Ba_xSr_{1-x}TiO_3$ used at cryogenic temperatures, e.g., 80K, has low barium content with x less than 0.1. The properties of low Ba content samples are more dependent on the substrate and therefore higher Ba content would be advantageous. The substituted compositions of this invention and particularly the $Ba_{0.6}Sr_{0.4}TiO_3$:6% La, 2% Al sample shows the best effect on increasing tunability of higher Ba content samples at 80K and has a tunability comparable to that of $Ba_{0.2}Sr_{0.8}TiO_3$. The effects of 4% La4% Al and 4% La4% Fe codoping are weaker. This might be caused by the impurity of $BaAl_2O_4$ in the 4% La4% Al sample and the lower loss in La, Fe substituted sample at low temperature. The selected equations of some of the samples at 80K are shown in Table 7.

TABLE 7

Tunability at 80K

| Example or Comp. Experiment - Composition | Tunability Equation |
|---|---|
| K $Ba_{0.2}Sr_{0.8}TiO_3$ | T = 67.9 E |
| J $Ba_{0.4}Sr_{0.6}TiO_3$ | T = 23.3 E |
| 5 $Ba_{0.6}Sr_{0.4}TiO_3$: 6% La 2% Al | T = 71.4 E |
| 8 $Ba_{0.6}Sr_{0.4}TiO_3$: 4% La 4% Al | T = 12.3 E |
| 2 $Ba_{0.6}Sr_{0.4}TiO_3$: 4% La 4% Fe | T = 18.5 E |

What is claimed is:

1. A ferroelectric composition with the formula $(Ba_{1-y}Sr_y)_{1-x}La_xTi_{1-x}Fe_xO_3$ wherein y is greater than zero and less than about 0.6 and x is from about 0.01 to about 0.06.

2. The ferroelectric composition of claim 1 wherein y is from about 0.2 to about 0.5 and x is from about 0.03 to about 0.05.

3. The ferroelectric composition of claim 2 wherein y is about 0.4 and x=0.04.

4. A tunable microwave thin film device comprising a ferroelectric composition with the formula $(Ba_{1-y}Sr_y)_{1-x}La_xTi_{1-x}Fe_xO_3$ wherein y is greater than zero and less than about 0.6 and x is from about 0.01 to about 0.06.

5. The tunable microwave thin film device of claim 4 wherein y is from about 0.2 to about 0.5 and x is from about 0.03 to about 0.05.

6. The tunable microwave thin film device of claim 5 wherein y is about 0.4 and x=0.04.

* * * * *